(12) United States Patent
Harley et al.

(10) Patent No.: US 8,166,365 B2
(45) Date of Patent: Apr. 24, 2012

(54) CYCLE SLIP LOCATION AND CORRECTION

(75) Inventors: James Harley, Nepean (CA); Kim B. Roberts, Nepean (CA); Han Sun, Ottawa (CA)

(73) Assignee: Ciena Corporation, Linthicum, MD (US)

( * ) Notice: Subject to any disclaimer, the term of this patent is extended or adjusted under 35 U.S.C. 154(b) by 811 days.

(21) Appl. No.: 12/326,933

(22) Filed: Dec. 3, 2008

(65) Prior Publication Data

US 2010/0138722 A1    Jun. 3, 2010

(51) Int. Cl.
*H03M 13/11* (2006.01)
(52) U.S. Cl. .......................... 714/752; 714/762
(58) Field of Classification Search ............... 714/752, 714/762
See application file for complete search history.

(56) References Cited

U.S. PATENT DOCUMENTS

| | | | | |
|---|---|---|---|---|
| 4,959,834 | A * | 9/1990 | Aikawa et al. | 714/798 |
| 5,050,171 | A * | 9/1991 | Ishijima | 714/798 |
| 5,285,458 | A * | 2/1994 | Yoshida | 714/775 |
| 5,822,339 | A * | 10/1998 | Hart | 714/775 |
| 5,995,512 | A | 11/1999 | Pogue, Jr. | |
| 6,683,855 | B1 * | 1/2004 | Bordogna et al. | 370/244 |
| 7,522,841 | B2 * | 4/2009 | Bontu et al. | 398/154 |
| 7,797,614 | B2 * | 9/2010 | Karam | 714/785 |
| 7,978,972 | B2 * | 7/2011 | Ohira et al. | 398/25 |
| 8,020,077 | B1 * | 9/2011 | Gorshe | 714/777 |
| 2007/0092260 | A1 | 4/2007 | Bontu et al. | |

FOREIGN PATENT DOCUMENTS

WO    WO01/33828 A    5/2001

OTHER PUBLICATIONS

International Search Report issued Feb. 1, 2010 against applicant's corresponding International PCT Patent Application No. PCT/CA2009/1604 filed Nov. 12, 2009.

* cited by examiner

*Primary Examiner* — Stephen Baker
(74) *Attorney, Agent, or Firm* — Kent Daniels; Blake, Cassels & Graydon LLP

(57) ABSTRACT

Methods and techniques are disclosed for correcting the effect of cycle slips in a coherent communications system. A signal comprising SYNC bursts having a predetermined periodicity and a plurality of known symbols at predetermined locations between successive SYNC bursts is received. The received signal is partitioned into data blocks. Each data block encompasses at least data symbols and a set of check symbols corresponding to the plurality of known symbols at predetermined locations between a respective pair of successive SYNC bursts in the signal. Each data block is processed to detect a cycle slip. When a cycle slip is detected, the set of check symbols of the data block are examined to identify a first slipped check symbol, and a phase correction applied to data symbols of the data block lying between the first slipped check symbol and an end of the data block.

8 Claims, 4 Drawing Sheets

CYCLE SLIP LOCATION AND CORRECTION

CROSS-REFERENCE TO RELATED APPLICATIONS

This application is the first application filed for the present invention.

MICROFICHE APPENDIX

Not Applicable.

TECHNICAL FIELD

The present invention relates generally to optical communication systems, and in particular to systems and methods for cycle slip detection and correction in a coherent receiver.

DESCRIPTION OF THE PRIOR ART

In optical communication systems that employ coherent optical receivers, the modulated optical signal received at the coherent receiver is mixed with a narrow-line-width local oscillator (LO) signal, and the combined signal is made incident on one or more photodetectors. The frequency spectrum of the electrical current appearing at the photodetector output (s) is substantially proportional to the convolution of the received optical signal and the local oscillator (LO), and contains a signal component lying at an intermediate frequency that contains data modulated onto the received signal. Consequently, this "data component" can be isolated and detected by electronically filtering and processing the photodetector output current.

The LO signal is typically produced using a semiconductor laser, which is typically designed to have a frequency that closely matches the frequency of the laser producing the carrier signal at the transmitter. However, as is known in the art, such semiconductor lasers exhibit a finite line width and non-zero phase noise. As a result, frequency transients as high as ±400 MHz at rates of up to 50 kHz are common. In addition, many such lasers often exhibit a maximum line width tolerance of about ±2 MHz. As a result, even when the transmitter and LO lasers are operating at nominally the same frequency, a mismatch or offset of as much as ±4 MHz can still exist. Short period phase noise in both the transmitter and LO laser may significantly increase the frequency mismatch beyond this amount.

A frequency mismatch between the received carrier (that is, the transmitter laser) and the LO appears as a time-varying phase error of detected symbols. When this phase error reaches $\pi/4$ for QPSK, for example, or $\pi/2$ for BPSK, a "cycle-slip" can occur, in which symbols can be erroneously interpreted as lying in an adjacent decision region. This can result in the erroneous interpretation of every symbol (and thus all data) following the cycle-slip.

Techniques are known in the art for estimating when a cycle slip occurs and/or for mitigating the impact of a cycle slip. For example, Applicant's co-pending U.S. Patent Application Publication No. US2007/0092260 teaches techniques for detecting the presence of a cycle slip in a given data block, and for mitigating its effects. As described in U.S. Patent Application Publication No. US2007/0092260, periodic SYNC bursts are inserted into the optical signal at the transmitter. Because the symbol sequence and timing of each SYNC burst is known, it is possible to use each SYNC burst to detect the presence of a cycle slip within the block of data symbols and reset the sample phase to limit the number of symbols that are impacted by the cycle slip. However, the methods disclosed in U.S. Patent Application Publication No. US2007/0092260 are unable to estimate the location of the cycle slip within the data block.

The presence of a cycle slip means that every data symbol between the cycle slip and the next SYNC burst will be erroneously decoded. As described in U.S. Patent Application Publication No. US2007/0092260, this implies that, among data blocks that contain a cycle slip, an average of one half of the data symbols in each affected data block will be errored. In embodiments in which Forward Error Correction (FEC) techniques are relied upon to recover bit errors resulting from cycle slips, the FEC must be strong enough to correct at least this number of successive errored symbols in order to limit the number of lost data blocks. U.S. Patent Application Publication No. US2007/0092260 teaches a combined forward and reverse decoding technique which reduces the average number of errored symbols to one-quarter of the symbols between successive SYNC bursts, but this still leaves a requirement for strong FEC to correct the errored symbols.

As is known in the art, a given forward error correction (FEC) method is capable of correcting up to a maximum number of errored bits (or symbols) at the receiver. This known maximum number of errored bits can be referred to as a "FEC budget", which can then be committed to correcting errors due to noise and cycle-slips. Naturally, the portion of the FEC budget assigned to cycle slips reduces the remaining FEC budget that is available for correcting errored symbols due to noise. As the symbol rate of optical communication systems increases, sensitivity to noise also increases, and so does the desirability of devoting a larger portion of the FEC budget to noise correction.

Techniques for detecting and mitigating cycle slips with less reliance on Forward Error Correction (FEC) remain highly desirable.

SUMMARY OF THE INVENTION

There are disclosed methods and techniques for correcting the effect of cycle slips in an optical communications system.

In one aspect of the invention, a signal comprising SYNC bursts having a predetermined periodicity and a plurality of known symbols at predetermined locations between successive SYNC bursts is received. The received signal is partitioned into data blocks. Each data block encompasses at least data symbols and a set of check symbols corresponding to the plurality of known symbols at predetermined locations between a respective pair of successive SYNC bursts in the signal. Each data block is processed to detect a cycle slip. When a cycle slip is detected, the set of check symbols of the data block are examined to identify a first slipped check symbol, and a phase correction applied to data symbols of the data block lying between the first slipped check symbol and an end of the data block.

In one embodiment, each check symbol is examined beginning at the check symbol adjacent the next SYNC burst and progressing towards the first SYNC burst. Each examined check symbol is identified as a slipped check symbol if it is errored relative to its corresponding known symbol. The first check symbol not identified as a slipped check symbol is designated as lying ahead of the cycle slip. If the check symbol lying ahead of the cycle slip is adjacent to the next SYNC burst, it is designated as the first slipped check symbol; otherwise, the previously examined check symbol is designated as the first slipped check symbol.

In another embodiment, each check symbol is examined to determine if it is errored relative to its corresponding known symbol, and if so, it is identified as a candidate slip location. For each candidate slip location, a common correction is then applied to the candidate slip location and to all check symbols between the candidate slip location and the next SYNC burst. The error rate is then calculated subsequent to the correction. The first slipped check symbol is then identified as the candidate slip location having the smallest respective error rate.

BRIEF DESCRIPTION OF THE DRAWINGS

Representative embodiments of the invention will now be described by way of example only with reference to the accompanying drawings, in which.

It will be noted that throughout the appended drawings, like features are identified by like reference numerals.

DETAILED DESCRIPTION OF PREFERRED EMBODIMENTS

In very general terms, the present invention builds upon the techniques presented in Applicant's co-pending U.S. Patent Application Publication No. US2007/0092260 to provide efficient methods for detecting the approximate location of a cycle slip between two successive SYNC bursts, and to apply a correction that reduces the number of symbols affected by the cycle slip. Forward Error Correction (FEC) may then be used to correct residual errored symbols/bits, but the FEC budget that must be assigned to correction of cycle slips is dramatically reduced.

Figure 1A:
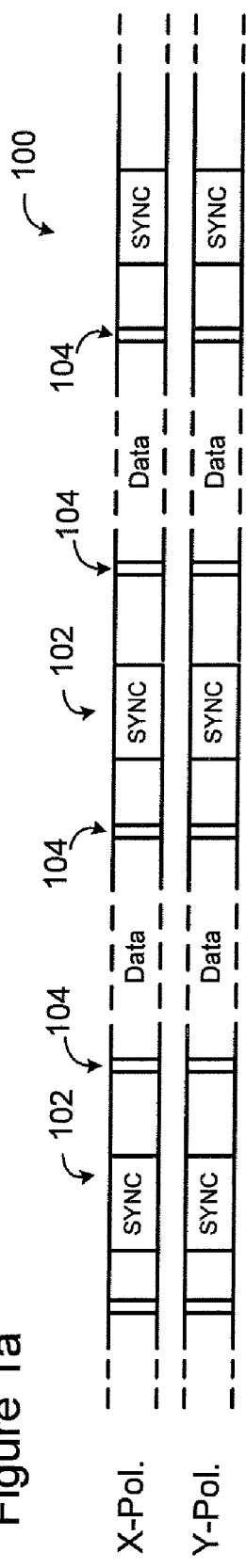
FIGS. 1a and 1b schematically illustrate respective optical signals.
Figure 1B:
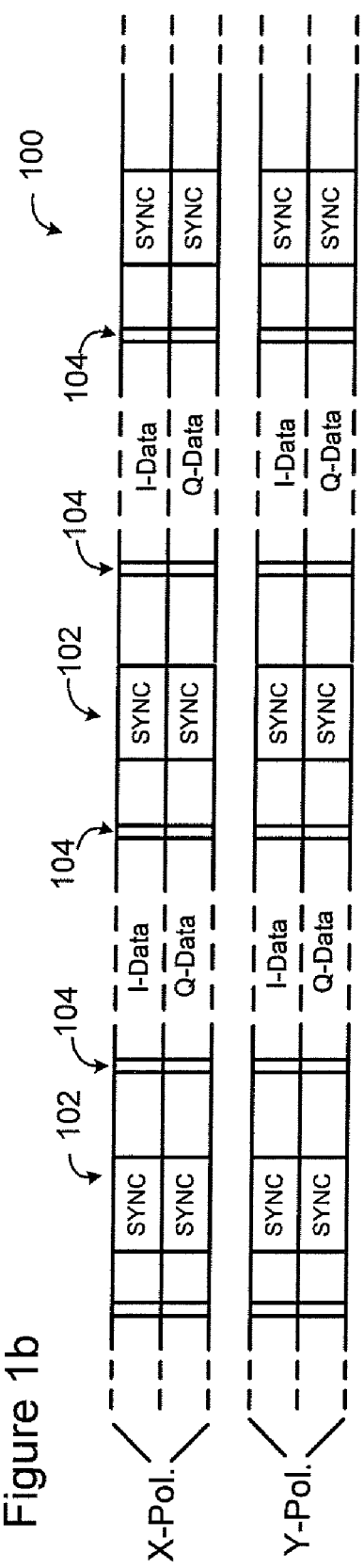

FIG. 1a schematically illustrates two digital data streams to be transmitted over an optical link. Each data stream 100 is respectively modulated onto X and Y polarizations of the transmitted optical signal. SYNC bursts 102 having a predetermined symbol sequence are embedded in each data stream 100 at regularly spaced intervals. FIG. 1b illustrates an alternative arrangement, in which each of the I and Q components of each transmitted polarization is assigned a respective orthogonal bit sequence. In both of the above cases, known bits or symbols 104 are embedded at predetermined locations within the block of data symbols between successive SYNC bursts.

The format, content and repetition rate of the SYNC bursts 102 are preferably selected following the considerations described in detail in Applicant's co-pending U.S. Patent Application Publication No. US2007/0092260, and thus will not be repeated herein.

As described in U.S. Patent Application Publication No. US2007/0092260, the timing of each SYNC burst 102 can be detected at the receiver by autocorrelation.

Autocorrelation techniques can also be used to estimate the sign and magnitude of the cycle slip. For example, the known symbol sequence of the SYNC burst 102 can be used to compute respective "errored SYNC bursts" corresponding to cycle slips of, for example, −2, −1, +1 and +2 decision regions. Correlation between each of these "errored SYNC bursts" and the corresponding symbol values of the received optical signal can be used to identify the most likely sign and magnitude of the cycle slip. Other methods can also be used to detect cycle slips. For example, U.S. Patent Application Publication No. US2007/0092260 describes a "forward and reverse" decoding scheme in which overlapping blocks of data symbols are distributed across multiple channels. Within one channel, a forward decoding operation is performed using the detector phase established by the immediately preceding SYNC burst, whereas in an adjacent channel, a reverse decoding operation is performed using the detector phase established by the immediately following SYNC burst. In the absence of a cycle slip, the decoded symbols lying within the overlap region will be identical in both channels, so a difference between the overlapping symbols in each channel indicates the presence of a cycle slip within the data block, but not its location.

The format, content and repetition rate of the known symbols 104 are preferably selected to achieve a desired balance between performance of cycle-slip detection and compensation on the one hand, and overhead on the other. In some embodiments, each known symbol 104 may be a single bit, although multi-bit symbols may be used, if desired. In some embodiments, all of the known symbols 104 may have the same value (e.g. binary "1"), but a known sequence of symbols may equally be used. In the embodiments of FIGS. 1a and 1b, known symbols 104 are inserted into both transmitted polarizations, although this is not essential. If desired, known symbols 104 may be inserted into only one polarization, and used to compensate cycle slips affecting both polarizations.

Figure 2:
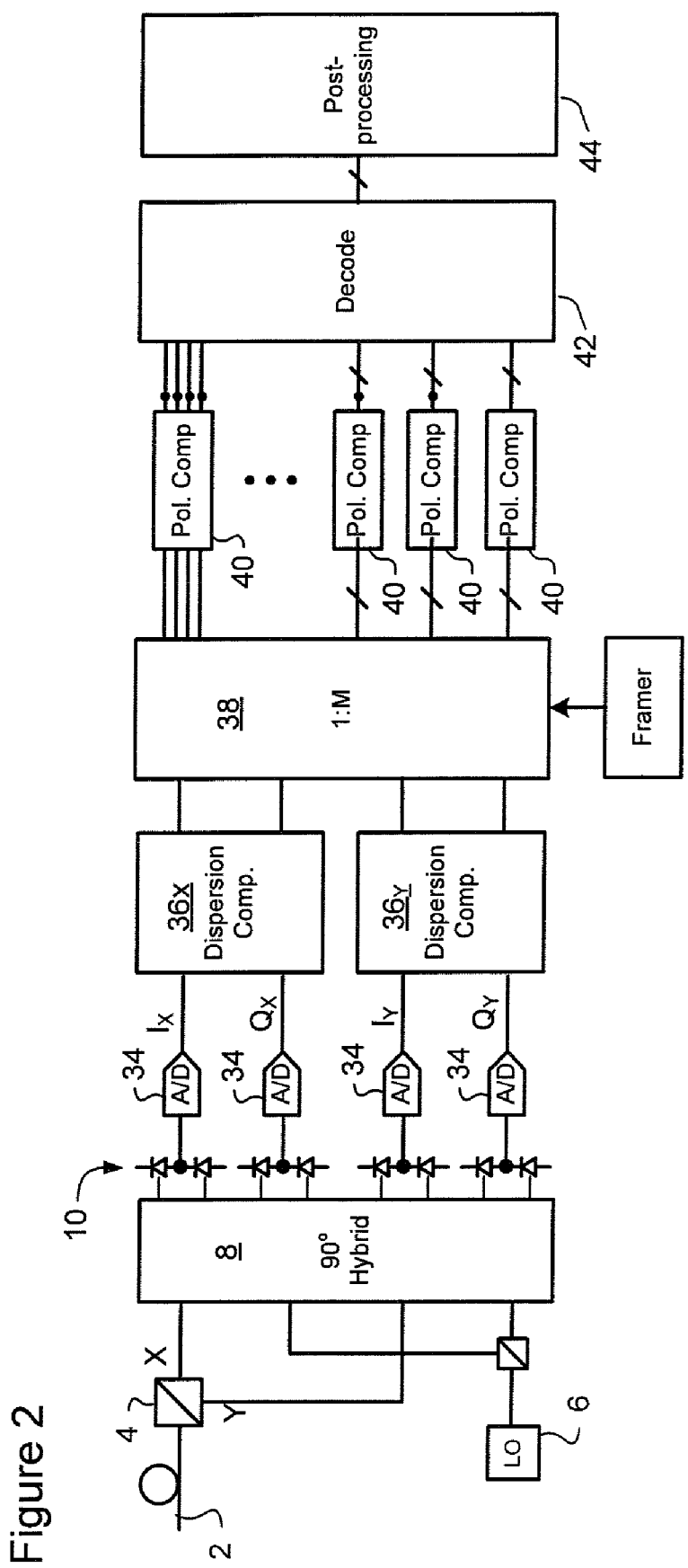
FIG. 2 is a block diagram of an optical communication system.

FIG. 2 schematically illustrates a representative coherent optical receiver in which the above-described optical signal format is used to enable robust localization and correction of cycle slips.

In the coherent optical receiver of FIG. 2, an inbound optical signal is received through an optical link 2, split into orthogonal polarizations by a Polarization Beam Splitter 4, and then mixed with a Local Oscillator (LO) signal 6 by a conventional 90° optical hybrid 8. The optical signal may, for example, be a high speed optical signal of the type described above with reference to FIG. 1b. The composite optical signals emerging from the optical hybrid 8 are supplied to respective photodetectors 10, which generate corresponding analog signals. The photodetector signals are sampled by respective Analog-to-Digital (A/D) converters 34 to yield multi-bit digital sample streams corresponding to In-phase (I) and Quadrature (Q) components of each of the received polarizations. Although two photodetectors are shown for each A/D in FIG. 2, in some embodiments only one photodetector can used for each A/D with satisfactory performance.

From the A/D converter 34 block, the I and Q sample streams of each received polarization are supplied to a respective dispersion compensator 36, which operates on the sample stream(s) to compensate chromatic dispersion of the optical link. Various methods are known for performing this function, such as, for example Finite Impulse Response (FIR) filters. The dispersion compensators 36 can be implemented using any suitable combination of hardware and/or software. In some embodiments, an Application Specific Integrated Circuit (ASIC) or a Field Programmable Gate Array (FPGA) may be used.

The dispersion-compensated sample streams appearing at the output of the dispersion compensators 36 are then supplied to a 1:M distribution unit 38, which operates to divide the signal path, by selectively routing blocks of samples from the dispersion compensators 36 into each one of the M paths. Within each path, a polarization compensator 40 operates to de-convolve the transmitted I and Q signal components of each polarization from the dispersion-compensated sample streams. The distortion-compensated sample streams appearing at the output of each polarization compensator 40 are then supplied to a respective decoder 42 for detection of data symbols and recovery of data. As with the dispersion compensators 36, the distribution unit 38, polarization compensator 40 and decoders 40 can be implemented (either separately of together) using any suitable combination of hardware and/or software. In some embodiments, an Application Specific Integrated Circuit (ASIC) or a Field Programmable Gate Array (FPGA) may be used.

As explained earlier, there exists a frequency mismatch between the received optical signal carrier and LO 6, which appears as a time-varying phase error of the symbol estimates output from the polarization compensators 40. This may result in periodic cycle slips. When a cycle slip occurs, the decoder 42 will erroneously interpret every symbol following the slip until the correct symbol phase is re-established, for example by the decoder resetting the sample phase upon receipt of the next SYNC burst. As was also explained above, U.S. Patent Application Publication No. US2007/0092260 provides various means by which the decoder 42 can detect the presence, but not the location, of a cycle slip within a data block.

Once a cycle slip is detected, the data block in which the cycle slip occurred is forwarded to a post-processor 44 to estimate the location of the slip within the data block and to apply a correction so as to reduce the number of errored bits due to the detected cycle slip. The post-processor 44 can be implemented using any suitable combination of hardware and/or software. In some embodiments, an Application Specific Integrated Circuit (ASIC) or a Field Programmable Gate Array (FPGA) may be used.

Representative methods of estimating the location of the cycle slip within the data block and applying a correction are discussed below with reference to FIG. 3 and FIG. 4. For the sake of convenience in the following description, the set of decoded symbols in the decoded data block corresponding to each of the known symbols 104 in the transmitted data block are referred to herein as check symbols. The set of check symbols in each data block are compared to their respective known symbol values to identify which ones of the check symbols are in error. As may be appreciated, noise will tend to produce randomly errored check symbols, whereas a cycle slip will produce a continuous sequence of errored check symbols which starts at the first check symbol after the cycle slip and extends to the last check symbol in the data block. For convenience, the first check symbol after the cycle slip will be referred to herein as the "first slipped check symbol". One method of identifying the first slipped check symbol and applying a correction is shown in FIG. 3.

Figure 3:
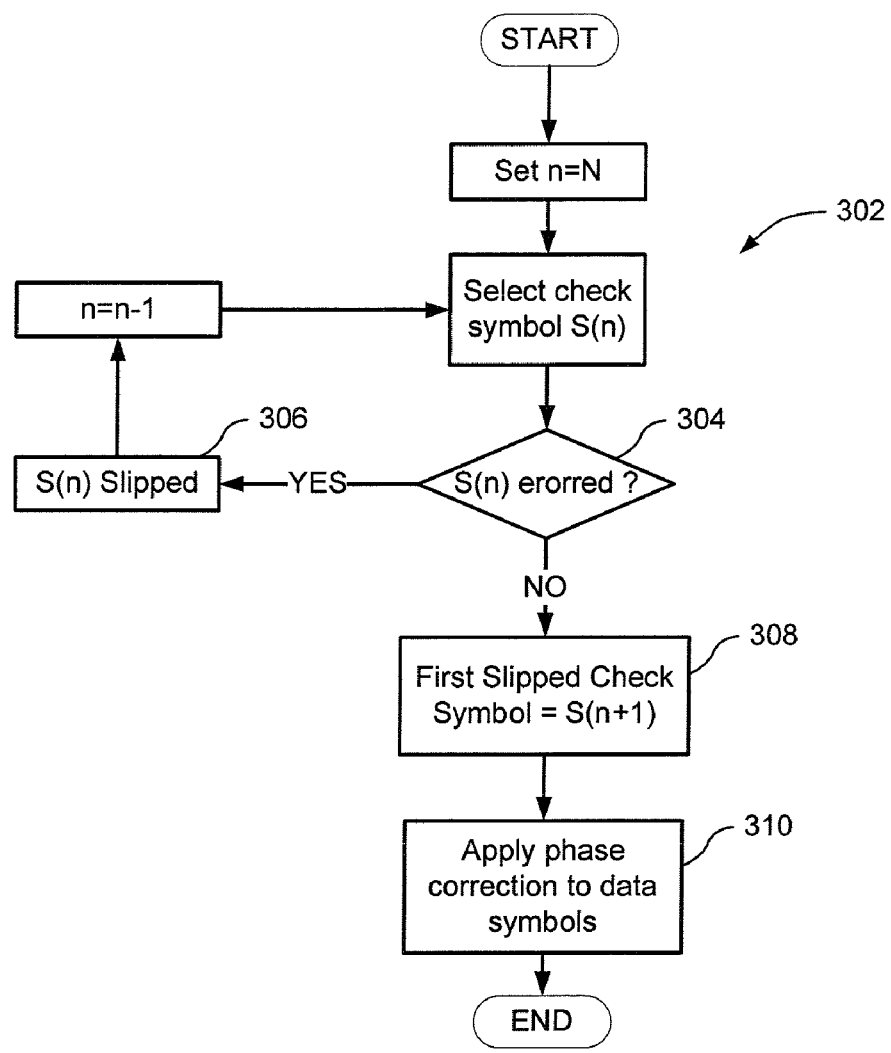
FIG. 3 is a representation of one embodiment of a method of correcting an effect of a cycle slip.

As may be seen in FIG. 3, each check symbol is examined in turn (at 302), starting from the last check symbol (n=N) in the data block and progressing toward the front (or leading) check symbol of the data block. Each check symbol that has an incorrect value (at 304), as compared to its corresponding known symbol, may be considered to be affected by the cycle slip, and so designated as a "slipped" check symbol (at 306). The first check symbol that is found (at step 304) to have a correct value is taken as being ahead of the cycle slip, and so the location of the cycle slip can be considered to lie between that (correct) check symbol S(n) and the immediately following check symbol S(n+1) in the data block, which is the first slipped check symbol (at 308). Once the first slipped check symbol has been found, a phase correction can be applied to all of the data symbols within the data block (at 310), starting at the first slipped check symbol and continuing to the end of the data block.

As may be appreciated, this process will leave a number of residual "slipped" data symbols, which remain uncorrected because they lie ahead of the first slipped check symbol. These residual slipped check symbols remain to be corrected by other methods, for example by Forward Error Correction. An advantage of the present method, however, is that on average, the number of residual slipped data symbols is one-half of the data symbols which lie between any two of the known (check) symbols, which will normally be very much less than the total number of data symbols between successive SYNC bursts.

In the foregoing description, the first slipped check symbol is identified as the first (or leading) one of a continuous sequence of errored check symbols which extends to the last check symbol in the data block. In many cases, this approach will work satisfactorily. However, in some cases, noise within the optical channel can cause errored check symbols, which may result in an erroneous identification of the first slipped check symbol. An alternative method, which is more robust to channel noise, is shown in FIG. 4.

Figure 4:
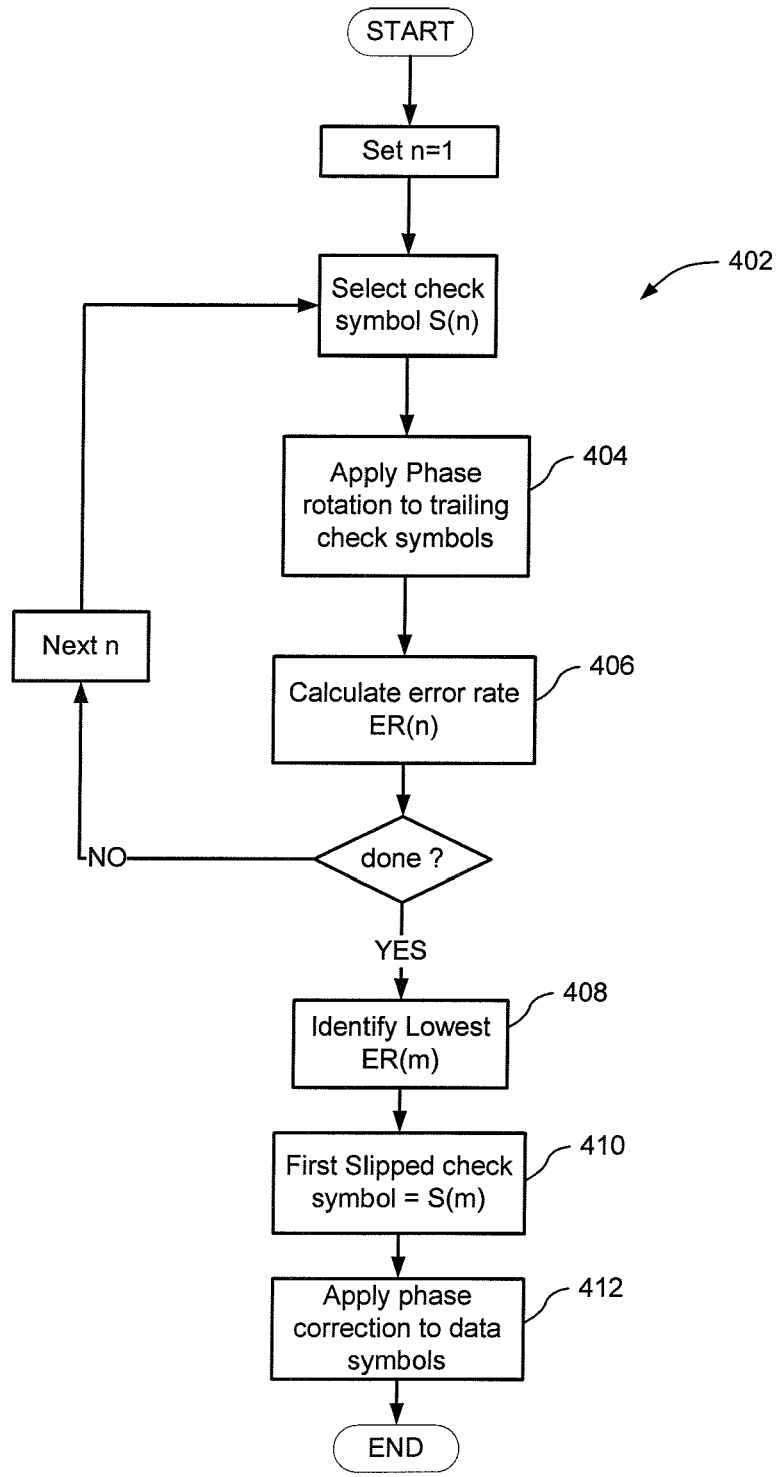
FIG. 4 is a representation of another embodiment of a method of correcting an effect of a cycle slip.

In the embodiment of FIG. 4, each check symbol is selected in turn (at 402), and a common phase rotation applied to each of the check symbols that follow the selected check symbol in the data block (at 404). A respective bit error rate is then calculated (at 406) across at least the phase rotated check symbols, and associated with the selected check symbol. In some embodiments, the error rate is computed across all of the check symbols in the data block, in including any non-phase rotated check symbols that lie between the check symbols being examined and the leading check symbols of the data block. In other embodiments, only the phase rotated check symbols may be considered for calculation of the error rate. Once respective error rates associated with each check symbol have been calculated, the lowest calculated error rate is identified (at 408) and the associated check symbol identified as the first slipped check symbol (at 410). Finally, a phase correction can be applied to all of the data symbols within the data block (at 412), starting at the first slipped check symbol and continuing to the end of the data block.

Although the invention has been described with reference to certain specific embodiments, various modifications thereof will be apparent to those skilled in the art without departing from the spirit and scope of the invention as outlined in the claims appended hereto.

We claim:

1. A method of correcting an effect of cycle slips in an optical communications system, the method comprising steps of:

receiving an optical signal through the communications system, the signal comprising SYNC bursts having a predetermined periodicity and a plurality of known symbols at predetermined locations between successive SYNC bursts;

partitioning the received optical signal into data blocks, wherein each data block encompasses at least data symbols and a set of check symbols corresponding to the plurality of known symbols at predetermined locations between a respective pair of successive SYNC bursts in the optical signal;

processing each data block to detect a cycle slip, and, when a cycle slip is detected:

examining the set of check symbols of the data block to identify a first slipped check symbol; and applying a phase correction to data symbols of the data block lying between the first slipped check symbol and an end of the data block.

2. The method of claim 1 wherein examining the set of check symbols of the data block to identify the first slipped check symbol comprises steps of:

for each check symbol:
applying a common phase rotation to the check symbols of the data block starting at the check symbol and extending to the end of the data block; and
computing an error rate across at least the phase rotated check symbols, and associating the calculated error rate with the check symbol; and
identifying the first slipped check symbol as the check symbol associated with the lowest calculated error rate.

3. The method of claim 1 wherein the first slipped check symbol is a first check symbol in a continuous sequence of errored check symbols extending from the first slipped check symbol to the last check symbol of the data block.

4. The method of claim 3 wherein examining the set of check symbols of the data block to identify the first slipped check symbol comprises steps of:
examining each check symbol in turn, starting at the last check symbol and progressing towards a leading check symbol of the data block, until a first correct check symbol is found; and
identified a check symbol immediately following the first correct check symbol as the first slipped check symbol.

5. A coherent receiver for receiving an optical signal through an optical communications system, the coherent receiver comprising:
a detector for receiving the optical signal, the optical signal comprising SYNC bursts having a predetermined periodicity and a plurality of known symbols at predetermined locations between successive SYNC bursts;
a framer for partitioning the received optical signal into data blocks, wherein each data block encompasses at least data symbols and a set of check symbols corresponding to the plurality of known symbols at predetermined locations between a respective pair of successive SYNC bursts in the optical signal;
a decoder processing each data block to detect a cycle slip; and,
a post processor responsive to the decoder, for processing a data block affected by a cycle slip, the post processor implementing steps of:
examining the set of check symbols of the affected data block to identify a first slipped check symbol; and
applying a phase correction to data symbols of the affected data block lying between the first slipped check symbol and an end of the affected data block.

6. The coherent receiver of claim 5 wherein the first slipped check symbol is a first check symbol in a continuous sequence of errored check symbols extending from the first slipped check symbol to the last check symbol of the affected data block.

7. The coherent receiver of claim 6 wherein examining the set of check symbols of the data block to identify the first slipped check symbol comprises:
examining each check symbol in turn, starting at the last check symbol and progressing towards a leading check symbol of the data block, until a first correct check symbol is found; and
identified a check symbol immediately following the first correct check symbol as the first slipped check symbol.

8. The coherent receiver of claim 5 wherein examining the set of check symbols of the data block to identify the first slipped check symbol comprises:
for each check symbol:
applying a common phase rotation to the check symbols of the data block starting at the check symbol and extending to the end of the data block; and
computing an error rate across at least the phase rotated check symbols, and associating the calculated error rate with the check symbol; and
identifying the first slipped check symbol as the check symbol associated with the lowest calculated error rate.

\* \* \* \* \*